(12) United States Patent
Kodama et al.

(10) Patent No.: US 11,082,029 B2
(45) Date of Patent: Aug. 3, 2021

(54) ACOUSTIC WAVE DEVICE WITH MULTI-LAYER INTERDIGITAL TRANSDUCER ELECTRODE

(71) Applicant: Skyworks Solutions, Inc., Irvine, CA (US)

(72) Inventors: Tomoya Kodama, Kitakatsuragi-Gun (JP); Shinichi Hakamada, Moriguchi (JP); Hironori Fukuhara, Ibaraki (JP); Yosuke Hamaoka, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 1 day.

(21) Appl. No.: 16/580,329

(22) Filed: Sep. 24, 2019

(65) Prior Publication Data
US 2020/0106420 A1   Apr. 2, 2020

Related U.S. Application Data

(60) Provisional application No. 62/738,526, filed on Sep. 28, 2018.

(51) Int. Cl.
*H03H 9/145* (2006.01)
*H03H 9/02* (2006.01)
(Continued)

(52) U.S. Cl.
CPC .... *H03H 9/14541* (2013.01); *H03H 9/02834* (2013.01); *H03H 9/131* (2013.01);
(Continued)

(58) Field of Classification Search
CPC ............ H03H 9/64; H03H 9/205; H03H 9/54; H03H 9/02102; H03H 9/131; H03H 9/173;
(Continued)

(56) References Cited

U.S. PATENT DOCUMENTS 4,684,841 A * 8/1987 Este .................... H03H 3/08
                                                310/313 B
5,844,347 A   12/1998 Takayama et al.
(Continued)

FOREIGN PATENT DOCUMENTS

JP        2012/222458 A    11/2012

*Primary Examiner* — Robert J Pascal
*Assistant Examiner* — Jorge L Salazar, Jr.
(74) *Attorney, Agent, or Firm* — Knobbe, Martens, Olson & Bear, LLP

(57) ABSTRACT

Aspects of this disclosure relate to an acoustic wave device that includes a multi-layer interdigital transducer electrode. The acoustic wave device includes a piezoelectric layer and an interdigital transducer electrode on the piezoelectric layer. The interdigital transducer electrode includes a first interdigital transducer electrode layer positioned between a second interdigital transducer electrode layer and the piezoelectric layer. The second interdigital transducer electrode layer can include aluminum and having a thickness of at least 200 nanometers. The acoustic wave device can include a temperature compensation layer arranged such that the interdigital transducer electrode is positioned between the piezoelectric layer and at least a portion of the temperature compensation layer. Related filters, modules, wireless communication devices, and methods are disclosed.

20 Claims, 10 Drawing Sheets

(51) Int. Cl.
  *H03H 9/64* (2006.01)
  *H03H 9/205* (2006.01)
  *H03H 9/54* (2006.01)
  *H03H 9/13* (2006.01)

(52) U.S. Cl.
  CPC .............. *H03H 9/205* (2013.01); *H03H 9/54* (2013.01); *H03H 9/64* (2013.01)

(58) Field of Classification Search
  CPC .............. H03H 9/175; H03H 9/02574; H03H 9/02228; H03H 9/02834; H03H 9/02559; H03H 9/14541
  USPC ......................................... 333/133, 193–196
  See application file for complete search history.

(56) References Cited

U.S. PATENT DOCUMENTS

| | | | |
|---|---|---|---|
| 6,297,580 B1 | 10/2001 | Takayama et al. | |
| 6,377,138 B1 | 4/2002 | Takagi et al. | |
| 7,034,435 B2 | 4/2006 | Hakamada | |
| 9,331,667 B2 | 5/2016 | Steiner et al. | |
| 9,496,846 B2 | 11/2016 | Iwasaki et al. | |
| 2007/0018756 A1* | 1/2007 | Fujii .................... | H03H 9/0057 |
| | | | 333/193 |
| 2013/0271238 A1* | 10/2013 | Onda .................... | H03H 9/0571 |
| | | | 333/133 |
| 2016/0211829 A1 | 7/2016 | Iwaki et al. | |
| 2017/0099042 A1 | 4/2017 | Steiner et al. | |
| 2019/0149126 A1* | 5/2019 | Saji ...................... | H04B 1/0458 |
| | | | 333/133 |

\* cited by examiner

ACOUSTIC WAVE DEVICE WITH MULTI-LAYER INTERDIGITAL TRANSDUCER ELECTRODE

CROSS REFERENCE TO PRIORITY APPLICATION

This application claims the benefit of priority of U.S. Provisional Patent Application No. 62/738,526, filed Sep. 28, 2018 and titled "ACOUSTIC WAVE DEVICE WITH MULTI-LAYER INTERDIGITAL TRANSDUCER," the disclosure of which is hereby incorporated by reference in its entirety herein.

BACKGROUND

Technical Field

Embodiments of this disclosure relate to acoustic wave devices.

Description of Related Technology

An acoustic wave filter can include a plurality of acoustic resonators arranged to filter a radio frequency signal. Example acoustic wave filters include surface acoustic wave (SAW) filters and bulk acoustic wave (BAW) filters. A surface acoustic wave resonator of a surface acoustic wave filter typically includes an interdigital transductor electrode on a piezoelectric substrate. A surface acoustic wave resonator is arranged to generate a surface acoustic wave.

Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer. An acoustic wave filter with a relatively low insertion loss is generally desirable. Meeting a low level of insertion loss for an acoustic wave filter in certain design specifications can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave device that includes a piezoelectric layer, an interdigital transducer electrode on the piezoelectric layer, and a temperature compensation layer. The interdigital transducer electrode includes a first interdigital transducer electrode layer and a second interdigital transducer electrode layer. The first interdigital transducer electrode layer is positioned between the second interdigital transducer electrode layer and the piezoelectric layer. The second interdigital transducer electrode layer includes aluminum and has a thickness of at least 200 nanometers. The interdigital transducer electrode is positioned between the piezoelectric layer and at least a portion of the temperature compensation layer.

The thickness of the second interdigital transducer electrode layer can be sufficiently thick to saturate insertion loss improvement associated with the thickness of the second interdigital transducer electrode layer. The thickness of the second interdigital transducer electrode layer can be at least 250 nanometers. The thickness of the second interdigital transducer electrode layer can be less than 500 nanometers.

The temperature compensation layer can be a silicon dioxide layer. The temperature compensation layer can have a thickness in a range from 300 nanometers to 2.1 micrometers.

The first interdigital transducer electrode layer can be thinner than the second interdigital transducer electrode layer. The first interdigital transducer electrode layer can include molybdenum. The first interdigital transducer electrode layer can have a first side and a second side opposite the first side, in which the first side is in physical contact with the piezoelectric layer, and the second side is in physical contact with the second interdigital transducer electrode layer. The second interdigital transducer electrode layer can be in physical contact with the temperature compensation layer on a side opposite to the first interdigital transducer electrode.

The acoustic wave device can further include a support substrate, in which the piezoelectric layer being positioned over the support substrate.

The piezoelectric layer can be a lithium niobate layer. The piezoelectric layer can be a lithium tantalate layer.

The acoustic wave device can be a surface acoustic wave device configured to generate a surface acoustic wave.

Another aspect of this disclosure is an acoustic wave filter with reduced insertion loss. The acoustic wave filter includes an acoustic wave resonator and a plurality of additional acoustic wave resonators. The acoustic wave resonator includes a piezoelectric layer, a temperature compensation layer, and an interdigital transducer electrode positioned between the piezoelectric layer and at least a portion of the temperature compensation layer. The interdigital transducer electrode includes a first interdigital transducer electrode layer and a second interdigital transducer electrode layer. The first interdigital transducer electrode layer is positioned between the second interdigital transducer electrode layer and the piezoelectric layer. The second interdigital transducer electrode layer includes aluminum and has a thickness of at least 200 nanometers. The acoustic wave resonator and the plurality of additional acoustic wave resonators are together configured as a band pass filter with a radio frequency pass band. The thickness of the second interdigital transducer electrode layer causes insertion loss in the radio frequency pass band to be reduced.

The thickness of the second interdigital transducer electrode layer can be sufficiently thick to saturate insertion loss improvement associated with the thickness of the second interdigital transducer electrode layer. The thickness of the second interdigital transducer electrode layer can be less than 500 nanometers.

The temperature compensation layer can be a silicon dioxide layer.

The first interdigital transducer electrode layer can include molybdenum.

The band pass filter can have a center frequency in a range from 1.5 gigahertz to 2.5 gigahertz.

Another aspect of this disclosure is a packaged module that includes a packaging substrate a surface acoustic wave filter on the packaging substrate, and a power amplifier on the packaging substrate. The surface acoustic wave filter includes a piezoelectric layer and an interdigital transducer electrode on the piezoelectric layer. The interdigital transducer electrode includes a first interdigital transducer electrode layer and a second interdigital transducer electrode layer. The first interdigital transducer electrode layer is positioned between the second interdigital transducer electrode layer and the piezoelectric layer. The second interdigital transducer electrode layer includes aluminum and has a thickness of at least 200 nanometers. The power amplifier having an output coupled to an input of the surface acoustic wave filter. The power amplifier and the surface acoustic wave filter are enclosed within a common package.

The packaged module can further include a radio frequency coupler on the packaging substrate. The packaged module can further include a radio frequency switch on the packaging substrate. The surface acoustic wave filter can include a surface acoustic wave resonator including any suitable features disclosed herein.

Another aspect of this disclosure is a wireless communication device that includes a radio frequency front end and an antenna in communication with the radio frequency front end. The radio frequency front end includes an acoustic wave filter configured to filter a radio frequency signal. The acoustic wave filter including a piezoelectric layer and an interdigital transducer electrode on the piezoelectric layer. The interdigital transducer electrode includes a first interdigital transducer electrode layer and a second interdigital transducer electrode layer. The first interdigital transducer electrode layer is positioned between the second interdigital transducer electrode layer and the piezoelectric layer. The second interdigital transducer electrode layer includes aluminum and has a thickness of at least 200 nanometers.

The wireless communication device can be a mobile phone. The acoustic wave filter can include an acoustic wave resonator including any suitable features disclosed herein.

Another aspect of this disclosure is a method of manufacturing an acoustic wave device. The method includes providing a piezoelectric layer with a first interdigital transducer electrode layer thereon; and forming a second interdigital transducer electrode layer over the first interdigital transducer electrode layer such that the first interdigital transducer electrode layer is between the second interdigital transducer electrode layer and the piezoelectric substrate. The second interdigital transducer electrode layer includes aluminum and having a thickness of at least 200 nanometers.

The method can further include forming a silicon dioxide layer over the second interdigital transducer electrode layer. The acoustic wave device can include any suitable features disclosed herein.

Another aspect of this disclosure is a method of filtering a radio frequency signal with reduced insertion loss. The method includes providing a radio frequency signal to a surface acoustic wave filter, the surface acoustic wave filter including a temperature compensated surface acoustic wave resonator, the temperature compensated surface acoustic wave resonator including an interdigital transducer electrode on a piezoelectric layer and a temperature compensation layer over the interdigital transducer electrode, the interdigital transducer electrode including a first interdigital transducer layer and a second interdigital transducer layer positioned over the first interdigital transducer layer, the second interdigital transducer layer including an aluminum layer having a thickness of at least 200 nanometers. The method also includes filtering the radio frequency signal with the surface acoustic wave filter.

The surface acoustic wave filter can include any suitable features disclosed herein.

Another aspect of this disclosure is an acoustic wave device that includes a piezoelectric layer, an interdigital transducer electrode on the piezoelectric layer, and a temperature compensation layer on the interdigital transducer electrode. The interdigital transducer electrode includes a first interdigital transducer electrode layer and a second interdigital transducer electrode layer. The first interdigital transducer electrode layer is positioned between the second interdigital transducer electrode layer and the piezoelectric layer. The second interdigital transducer electrode layer has a thickness of at least 200 nanometers.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
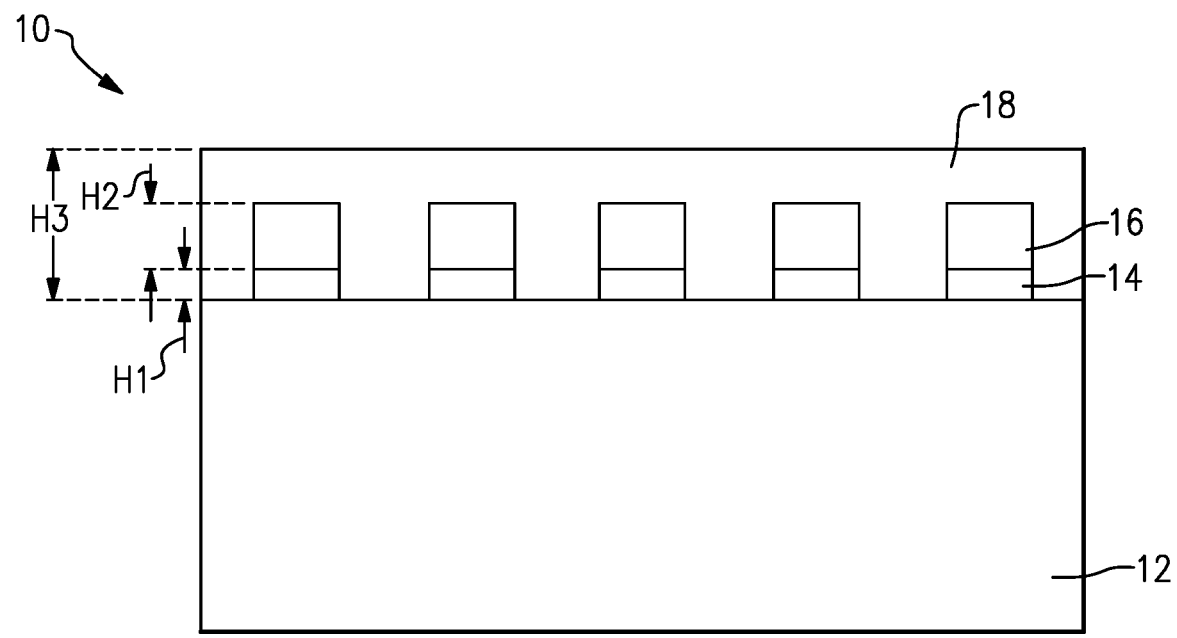
FIG. 1A is a cross sectional view of a surface acoustic wave device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Surface acoustic wave (SAW) devices can include a silicon dioxide ($SiO_2$) layer over an interdigital transducer electrode (IDT electrode). The silicon dioxide layer can provide temperature compensation to bring a temperature coefficient of frequency (TCF) closer to zero. Such SAW devices can be referred to as temperature compensated SAW (TCSAW) devices. Low insertion loss for a SAW device generally desirable. However, low insertion loss can be difficult to achieve.

Aspects of this disclosure relate to SAW devices with a multi-layered IDT electrode. The IDT electrode can include a lower electrode layer and an upper electrode layer, in which the lower electrode layer is positioned between the upper electrode layer and a piezoelectric layer. The upper electrode layer can be at least 200 nanometers (nm) thick and include aluminum. Such an electrode layer can reduce conductor loss without significantly impairing other electrical characteristics. This can lower insertion loss of the SAW device.

In an embodiment, a TCSAW device includes a double-layered IDT electrode that includes a first electrode layer, such as a molybdenum (Mo) layer, on a piezoelectric layer and an aluminum (Al) layer over the first electrode layer. The aluminum layer is thicker than the first electrode layer. The thickness of the aluminum layer can be at least 0.1 L in some applications, where L is a period of IDT electrode. The aluminum layer can reduce conductor loss without significantly impairing other electrical characteristics, such as the electromechanical coupling coefficient ($k^2$), and thus improve the insertion loss.

Because the acoustic impedances of silicon dioxide and aluminum can be relatively close, it is possible to allow the effect on the acoustic velocity, coupling coefficient, and the like to be reduced even though the aluminum electrode has a greater thickness such that the insertion loss is improved.

Other SAW devices can include a multi-layer IDT electrode, in which an upper layer of the IDT electrode is thinned to avoid deterioration of embedding properties of a silicon dioxide temperature compensation layer. However, such thinning can cause greater insertion loss. Embodiments disclosed herein include a multi-layered IDT electrode that can reduce insertion loss and maintain embedding properties of a silicon dioxide layer.

FIG. 1A is a cross sectional view of a surface acoustic wave device 10 according to an embodiment. The surface acoustic wave device 10 includes a multi-layer IDT electrode in which the upper IDT electrode has a thickness that reduces insertion loss relative to a thinner upper IDT electrode layer. As illustrated, the surface acoustic wave device 10 includes a piezoelectric layer 12, a multi-layer IDT electrode that includes a first IDT electrode layer 14 and a second IDT electrode layer 16, and a temperature compensation layer 18 over the multi-layer IDT electrode. The surface acoustic wave device 10 can be referred to as a temperature compensated surface acoustic wave device. In the surface acoustic wave device 10, the multi-layer IDT electrode includes separate IDT electrode layers that impact acoustic properties and electrical properties, respectively. Accordingly, electrical properties, such as insertion loss, can be improved by adjusting one of the IDT electrode layers without significantly impacting acoustic properties.

The piezoelectric layer 12 can be a lithium based piezoelectric layer. For example, the piezoelectric layer 12 can be a lithium niobate layer. As another example, the piezoelectric layer 12 can be a lithium tantalate layer. In the surface acoustic wave device 10, the multi-layer IDT electrode is over the piezoelectric layer 12.

The first IDT electrode layer 14 can be referred to as a lower electrode layer. The first IDT electrode layer 14 is disposed between the second IDT electrode layer 16 and the piezoelectric layer 12. As illustrated, the first IDT electrode layer 14 has a first side in physical contact with the piezoelectric layer 12 and a second side in physical contact with the second IDT electrode layer 16.

The first IDT electrode layer 14 can impact acoustic properties of the surface acoustic wave device 10. For instance, the thickness Hi of the first IDT electrode layer 14 can impact resonant frequency of the surface acoustic wave device 10. The first IDT electrode layer can include molybdenum (Mo), tungsten (W), gold (Au), silver (Ag), copper (Cu), platinum (Pt), ruthenium (Ru), titanium (Ti), the like, or any suitable combination thereof. For instance, the first IDT electrode layer 14 can be a molybdenum layer in certain applications. The first IDT electrode layer 14 can have a thickness Hi in a range from about 80 nm to 100 nm in certain applications. The first IDT electrode layer 14 can be thinner than the second IDT electrode layer 16.

The second IDT electrode layer 16 can be referred to as an upper electrode layer. The second IDT electrode layer 16 is disposed between the first IDT electrode layer 14 and the temperature compensation layer 18. As illustrated, the second IDT electrode layer 16 has a first side in physical contact with the first IDT electrode layer 14 and a second side in physical contact with the temperature compensation layer 18.

The second IDT electrode layer 16 can impact electrical properties of the surface acoustic wave device 10. The thickness of the second IDT electrode layer 16 can impact insertion loss of the surface acoustic wave resonator 10. The thickness of the second IDT electrode layer 16 may not significantly impact acoustic properties of the surface acoustic wave device 10. The second IDT electrode layer 16 can include aluminum (Al) or any suitable alloy thereof. The thickness $H_2$ of the second IDT electrode layer 16 can be based on aluminum conductivity determined by input power.

The thickness $H_2$ of the second IDT electrode layer 16 can be sufficiently thick to improve insertion loss relative to a thinner IDT electrode layer. For example, the thickness $H_2$ of the second IDT electrode layer 16 can be at least 200 nm. In some instances, the thickness $H_2$ of the second IDT electrode layer 16 can be sufficiently thick to saturate insertion loss improvement associated with the thickness of the second IDT electrode layer 16. The thickness $H_2$ can be sufficiently thick to improve insertion loss but not so thick as to significantly reduce electromechanical coupling coefficient ($k^2$). An upper limit of the thickness of the second IDT electrode layer 16 in the surface acoustic wave device 10 can be bounded by the thickness $H_3$ of the temperature compensation layer 18 minus the thickness $H_1$ of the first IDT electrode layer 14. In some instances, there can also be a margin for the temperature compensation layer 18 to cover the second IDT electrode layer 16. As one example, the thickness of the second IDT electrode layer 16 can be less than 500 nm in certain instances.

Although embodiments disclosed herein include IDT electrodes with two IDT electrode layers, any suitable principles and advantages disclosed herein can be applied to multi-layer IDT electrodes that include three or more IDT electrode layers.

In the surface acoustic wave device 10, the temperature compensation layer 18 can bring a temperature coefficient of frequency (TCF) of the surface acoustic wave device 10 closer to zero. The temperature compensation layer 18 can have a positive TCF. This can compensative for a negative TCF of the piezoelectric layer 12. The piezoelectric layer 12 can be lithium niobate or lithium tantalate, which both have a negative TCF. The temperature compensation layer 18 can be a dielectric film. The temperature compensation layer 18 can be a silicon dioxide layer. In some other embodiments, a different temperature compensation layer can be implemented. Some examples of other temperature compensation layers include a tellurium dioxide ($TeO_2$) layer or a silicon oxyfluoride (SiOF) layer. The temperature compensation layer 18 can have a thickness $H_3$ in a range from 300 nm to 2.1 micrometers (µm). In certain applications, the thickness $H_3$ of the temperature compensation layer 18 can be in a range from about 500 nm to 600 nm.

The surface acoustic wave device 10 and/or other acoustic wave devices disclosed herein can be included in a band pass filter. The band pass filter can have a passband with a center frequency in a range from 1.5 gigahertz (GHz) to 2.5 GHz. The center frequency can be an arithmetic mean or a geometric mean of a lower cutoff frequency of the passband and an upper cutoff frequency of the passband. The center frequency in a range from 1.5 GHz to 2.2 GHz in certain instances. The passband can have a bandwidth in a range from 5 megahertz (MHz) to 100 MHz in certain applications. The band pass filter can have a passband defined by a communication standard in which the passband is within a frequency range from 1.5 GHz to 2.5 GHz.

In some instances, the surface acoustic wave device 10 and/or other acoustic wave devices disclosed herein can be included in a band stop filter having a center frequency in a range from 1.5 GHz to 2.5 GHz. The stop band of the band stop filter can have a bandwidth in a range from 5 MHz to 100 MHz in certain applications.

Figure 1B:
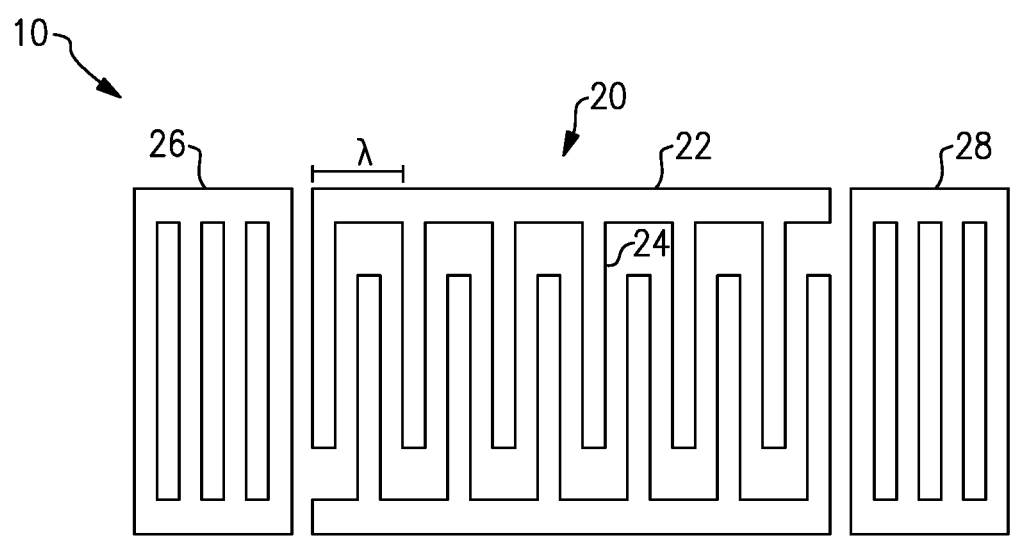
FIG. 1B illustrates an interdigital transducer electrode of the surface acoustic wave device of FIG. 1A in plan view.

FIG. 1B illustrates an interdigital transducer electrode 20 of the surface acoustic wave device 10 of FIG. 1A in plan view. The temperature compensation layer 18 is not shown in FIG. 1B to focus on the IDT electrode 20. The IDT electrode 20 is positioned between a first acoustic reflector 26 and a second acoustic reflector 28. The acoustic reflectors 26 and 28 are separated from the IDT electrode 20 by respective gaps. The IDT electrode 20 includes the bus bar 22 and IDT fingers 24 extending from the bus bar 22. The IDT fingers 24 have a pitch of λ. The surface acoustic wave device 10 can include any suitable number of IDT fingers 24. The pitch λ of the IDT fingers 24 corresponds to a resonant frequency of the surface acoustic wave device 10.

FIGS. 2 to 4B provide data related to the impact of the thickness $H_2$ of the second IDT electrode layer 16 of the surface acoustic wave device 10 of FIG. 1A on insertion loss. The data corresponds to a surface acoustic wave device 10 that includes a lithium niobate piezoelectric layer 12, a first IDT electrode layer 14 that is molybdenum with a thickness $H_1$ of 90 nm, a second IDT electrode layer 16 that is aluminum, and a temperature compensation layer 18 that is silicon dioxide having a thickness $H_3$ of 560 nm. FIGS. 2 to 4B each include data related to insertion loss for different thicknesses $H_2$ of the second IDT electrode layer 16.

Figure 2:
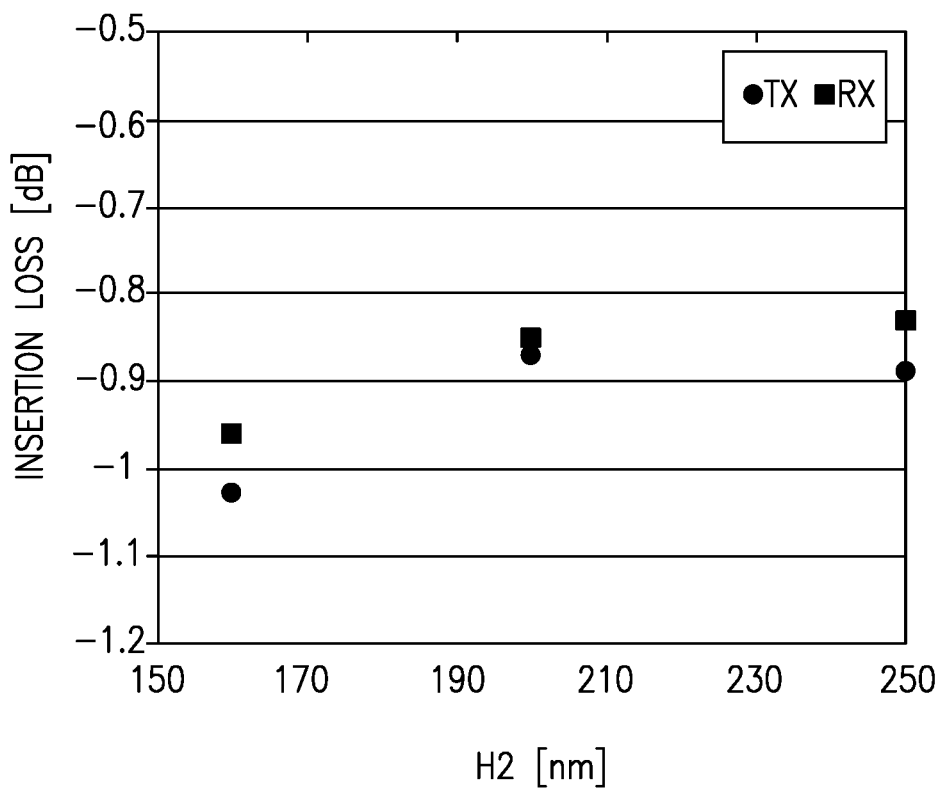
FIG. 2 is a graph of insertion loss versus thickness of an upper interdigital transducer electrode layer in the surface acoustic wave device of FIG. 1A.

FIG. 2 is a graph of insertion loss versus thickness of a second interdigital transducer electrode layer 16 in the surface acoustic wave device 10 of FIG. 1A. Data points for three different thicknesses $H_2$ of the second IDT electrode layer 16 for both transmit and receive filters are included. FIG. 2 shows that increasing the thickness $H_2$ of the second IDT electrode layer 16 improved (i.e., reduced) insertion loss. Insertion loss improvement can be saturated for a thicknesses $H_2$ of the second IDT electrode layer 16 of about 250 nm.

Figure 3B:
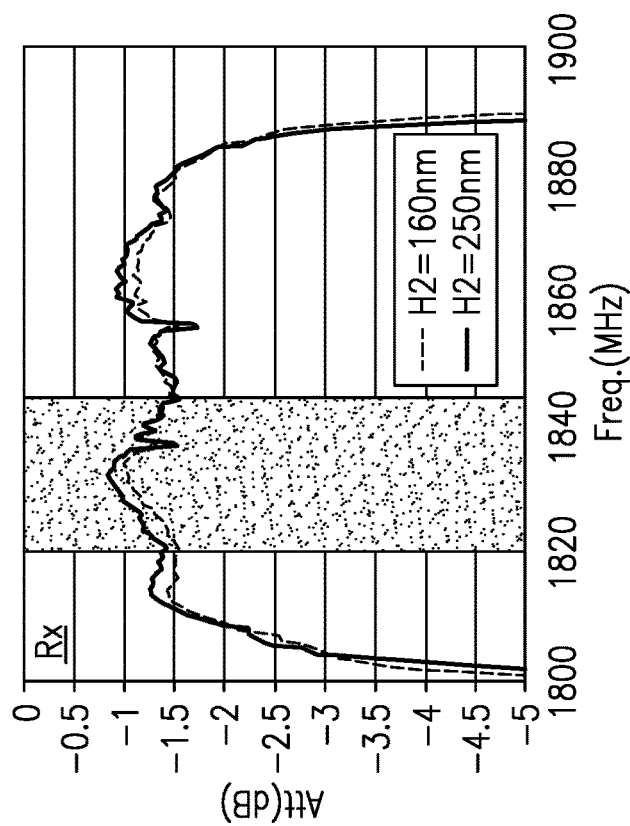
FIG. 3B is a graph of attenuation versus frequency for receive filters that include surface acoustic wave devices with upper interdigital transducer electrode layers with different thicknesses.
Figure 3A:
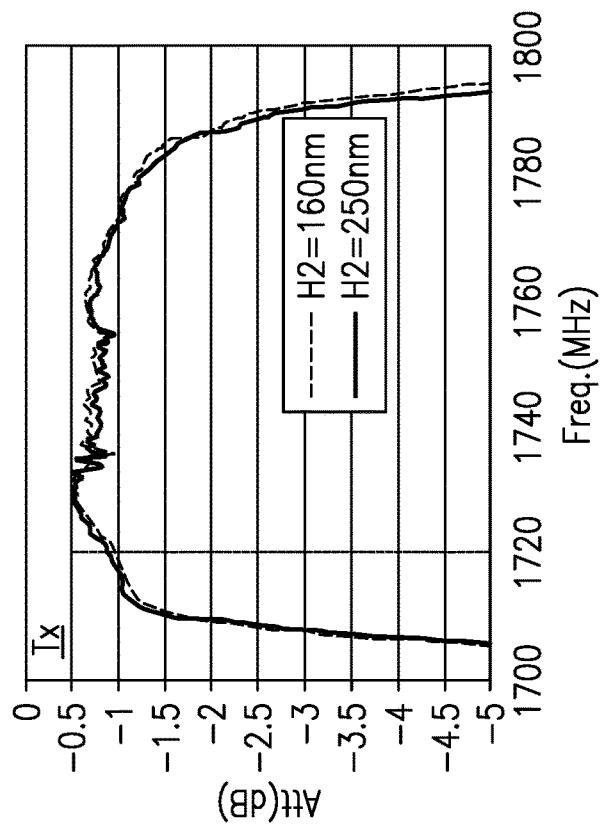
FIG. 3A is a graph of attenuation versus frequency for transmit filters that include surface acoustic wave devices with upper interdigital transducer electrode layers with different thicknesses.

FIG. 3A is a graph of attenuation versus frequency for transmit filters that include surface acoustic wave devices 10 with upper interdigital transducer electrode layers with different thicknesses. Attenuation curves are shown for upper IDT electrode thicknesses of 160 nm and 250 nm. There is less insertion loss in the passband for the SAW filter with the thicker upper IDT electrode layer. FIG. 3A indicates that an increased upper IDT electrode thickness $H_2$ can result in less insertion loss in the passband of a transmit filter. For example, at a frequency of 1720 MHz, the SAW filter that includes a thicker upper IDT electrode has less insertion loss than the SAW filter with the thinner upper IDT electrode.

FIG. 3B is a graph of attenuation versus frequency for receive filters that include surface acoustic wave devices with upper interdigital transducer electrode layers with different thicknesses. Attenuation curves are shown for upper IDT electrode layer thicknesses of 160 nm and 250 nm. There is less insertion loss in the passband for the SAW filter with the thicker upper IDT electrode layer. FIG. 3B indicates that an increased upper IDT electrode thickness $H_2$ can result in less insertion loss in the passband of a receive filter. For example, in a range from about 1820 MHz to 1845 MHz, the SAW filter that includes a thicker upper IDT electrode has less insertion loss than the SAW filter with the thinner upper IDT electrode.

Figure 4B:
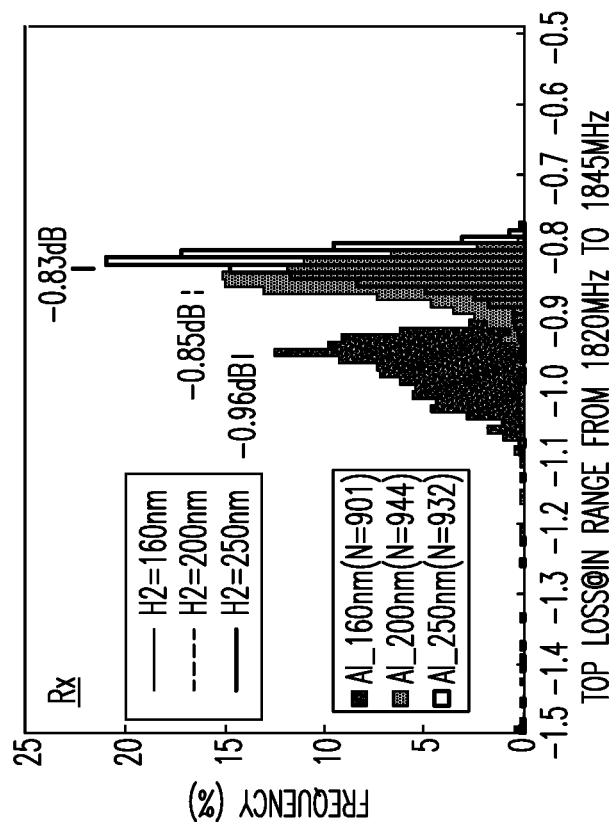
FIG. 4B is an insertion loss distribution graph for receive filters that include surface acoustic wave devices with upper interdigital transducer electrode layers with different thicknesses.
Figure 4A:
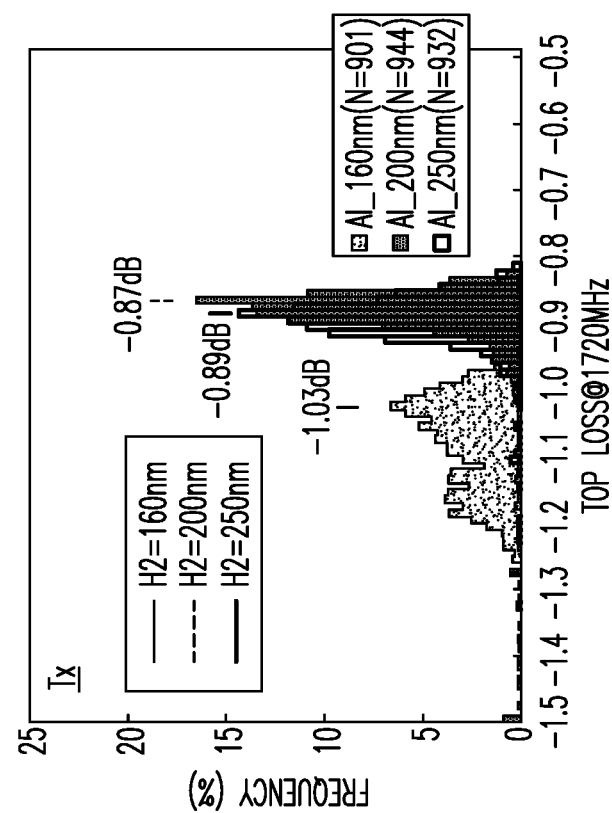
FIG. 4A is an insertion loss distribution graph for transmit filters that include surface acoustic wave devices with upper interdigital transducer electrode layers with different thicknesses.

FIG. 4A is an insertion loss distribution graph for transmit filters that include surface acoustic wave devices with upper interdigital transducer electrode layers with different thicknesses. The insertion loss distribution graph in FIG. 4A shows top loss at 1720 MHz. Histograms for the distribution of insertion loss for upper IDT electrode thicknesses of 160 nm, 200 nm, and 250 nm for transmit filters are shown. Over 900 samples were taken for each thickness. The SAW filters with upper IDT electrode thicknesses of 200 nm and 250 nm have better insertion loss at 1720 MHz than the SAW filters with an upper IDT electrode thickness of 160 nm. FIG. 4A indicates that at 200 nm, insertion loss improvement due to thickness of the upper IDT electrode is almost saturated. Accordingly, a thickness of 200 nm or greater for the upper IDT electrode can be desirable.

FIG. 4B is an insertion loss distribution graph for receive filters that include surface acoustic wave devices with upper interdigital transducer electrode layers with different thicknesses. The insertion loss distribution graph in FIG. 4B shows top loss in a range for frequencies from about 1820 MHz to 1845 MHz. Histograms for the distribution of insertion loss for upper IDT electrode thicknesses of 160 nm, 200 nm, and 250 nm for receive filters are shown. Over 900 samples were taken for each thickness. The SAW filters with upper IDT electrode thicknesses of 200 nm and 250 nm have better insertion loss in the specified frequency range than the SAW filters with an upper IDT electrode thickness of 160 nm. FIG. 4B indicates that at 200 nm, insertion loss improvement due to thickness of the upper IDT electrode is almost saturated. Accordingly, a thickness of 200 nm or greater for the upper IDT electrode can be desirable.

Figure 5:
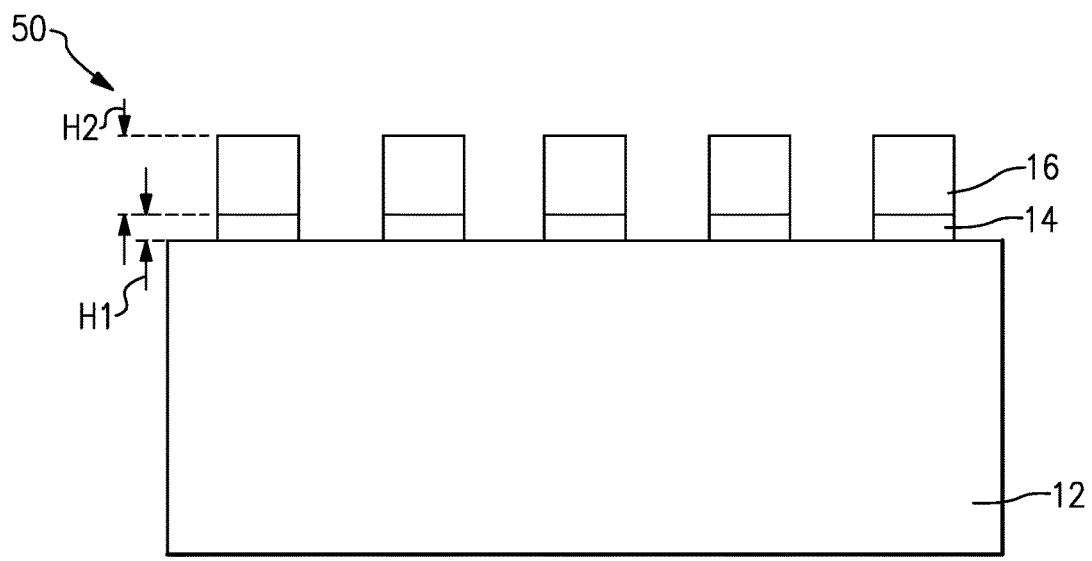
FIG. 5 is a cross sectional view of a surface acoustic wave device according to an embodiment.

FIG. 5 is a cross sectional view of a surface acoustic wave device 50 according to an embodiment. The surface acoustic wave device 50 is like the surface acoustic wave device 10 of FIG. 1A except that the surface acoustic wave device 50 does not include a temperature compensation layer 18. FIG. 5 illustrates that a multi-layer IDT electrode can be implemented in a SAW device without a temperature compensation layer over the multi-layer IDT electrode.

Figure 6A:
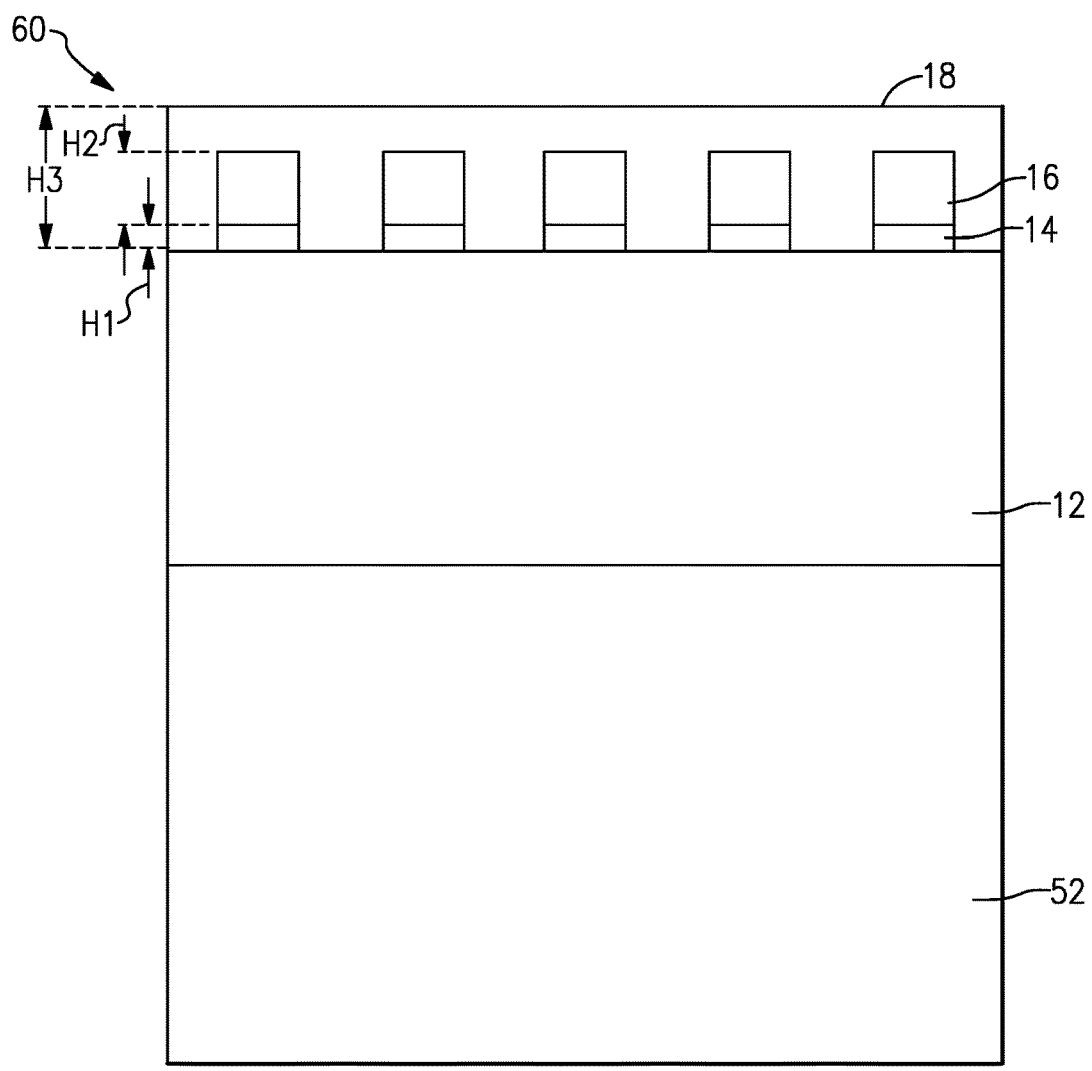
FIG. 6A is a cross sectional view of a surface acoustic wave device with a multi-layer piezoelectric substrate according to an embodiment.

FIG. 6A is a cross sectional view of a surface acoustic wave device 60 according to another embodiment. The surface acoustic wave device 60 is like the surface acoustic wave device 10 of FIG. 1A except that the surface acoustic wave device 60 additionally includes a substrate layer 52 on a side of the piezoelectric layer 12 that is opposite to the IDT electrode. FIG. 6A illustrates that a multi-layer IDT electrode can be implemented in a SAW device with a multi-layer piezoelectric substrate.

The substrate layer 52 can be any suitable substrate layer, such as a silicon layer, a quartz layer, a ceramic layer, a glass layer, a spinel layer, a magnesium oxide spinel layer, a sapphire layer, a diamond layer, a silicon carbide layer, a silicon nitride layer, an aluminum nitride layer, or the like. As one example, the surface acoustic wave device 60 can include a lithium niobate/silicon piezoelectric substrate in certain applications.

The substrate layer 52 can have a relatively high impedance. An acoustic impedance of the substrate layer 52 can be higher than an acoustic impedance of the piezoelectric layer 12. The acoustic impedance of the substrate layer 52 can be higher than an acoustic impedance of the temperature compensation layer 18. For instance, the substrate layer 52 can have a higher acoustic impedance than an acoustic impedance of silicon dioxide. A SAW device 60 with the piezoelectric layer 12 on a high impedance support substrate layer 52, such as silicon substrate, can achieve better TCF and thermal dissipation compared to a similar SAW device without the high impedance support substrate layer 52.

Figure 6B:
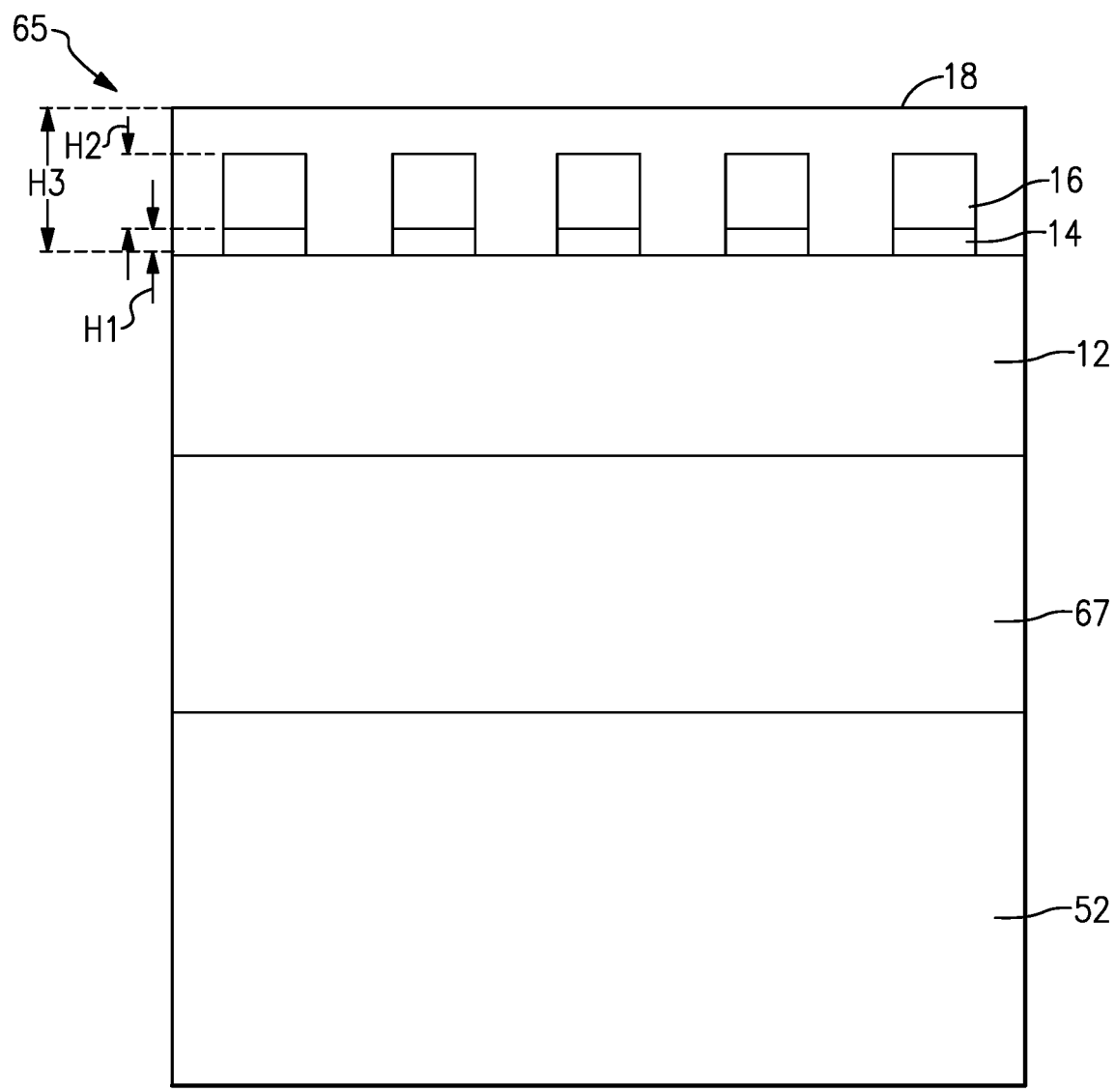
FIG. 6B is a cross sectional view of a surface acoustic wave device with a multi-layer piezoelectric substrate according to another embodiment.

In certain embodiments, two or more layers can be included on the side of the piezoelectric layer 12 that is opposite to the IDT electrode. FIG. 6B is a cross sectional view of a surface acoustic wave device 65 with a multi-layer piezoelectric substrate according to an embodiment. The surface acoustic wave device 65 is like the surface acoustic wave device 60 of FIG. 6A except that the surface acoustic wave device 65 also includes an additional layer 67 positioned between the piezoelectric layer 12 and the substrate layer 52.

The additional layer 67 can be a low impedance layer that has a lower acoustic impedance than the substrate layer 52. In some embodiments, the additional layer 67 can be a silicon dioxide ($SiO_2$) layer. The additional layer 67 can increase adhesion between layers of the multi-layer piezoelectric substrate. Alternatively or additionally, the additional layer 67 can increase heat dissipation in the SAW device 65 relative to the SAW device 60.

The additional layer 67 can reduce back reflection of the substrate layer 52 in certain applications. In such applications, the additional layer can scatter back reflections by beam scattering. In some instances, the additional layer 67 can be a polycrystalline spinel layer and the substrate layer 52 can be a silicon layer.

Figure 6C:
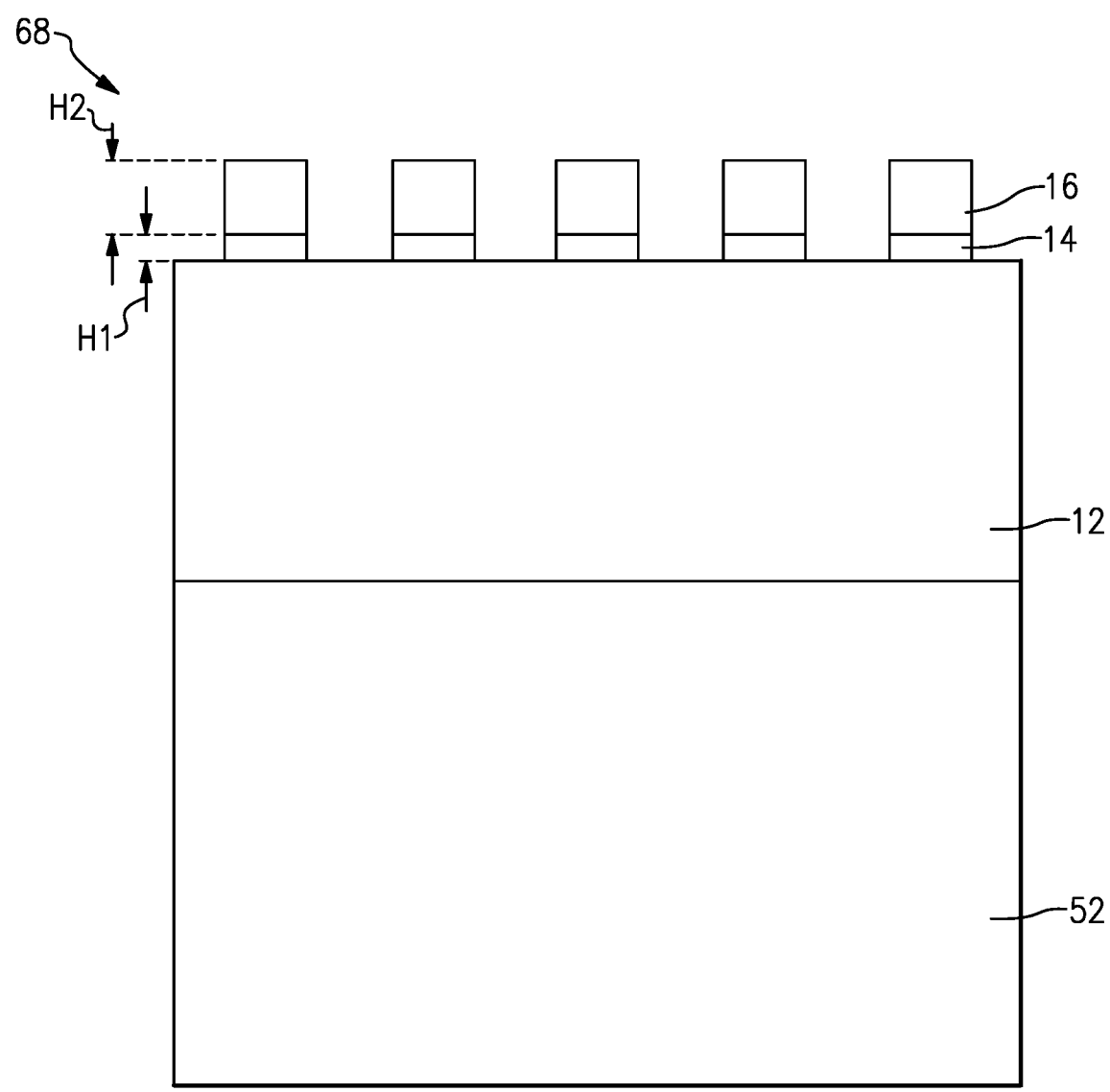
FIG. 6C is a cross sectional view of a surface acoustic wave device with a multi-layer piezoelectric substrate according to another embodiment.

FIG. 6C is a cross sectional view of a surface acoustic wave device 68 with a multi-layer piezoelectric substrate according to another embodiment. The surface acoustic wave device 68 is like the surface acoustic wave device 60 of FIG. 6A except that the surface acoustic wave device 68 is implemented without a temperature compensation layer over the interdigital transducer on a side opposite to the piezoelectric layer 12. FIG. 6C illustrates that certain multi-layer piezoelectric substrate SAW devices can be implemented with a multi-layer interdigital transducer electrode in accordance with any suitable principles and advantages disclosed herein and without a temperature compensation layer over the multi-layer interdigital transducer electrode.

Figure 7:
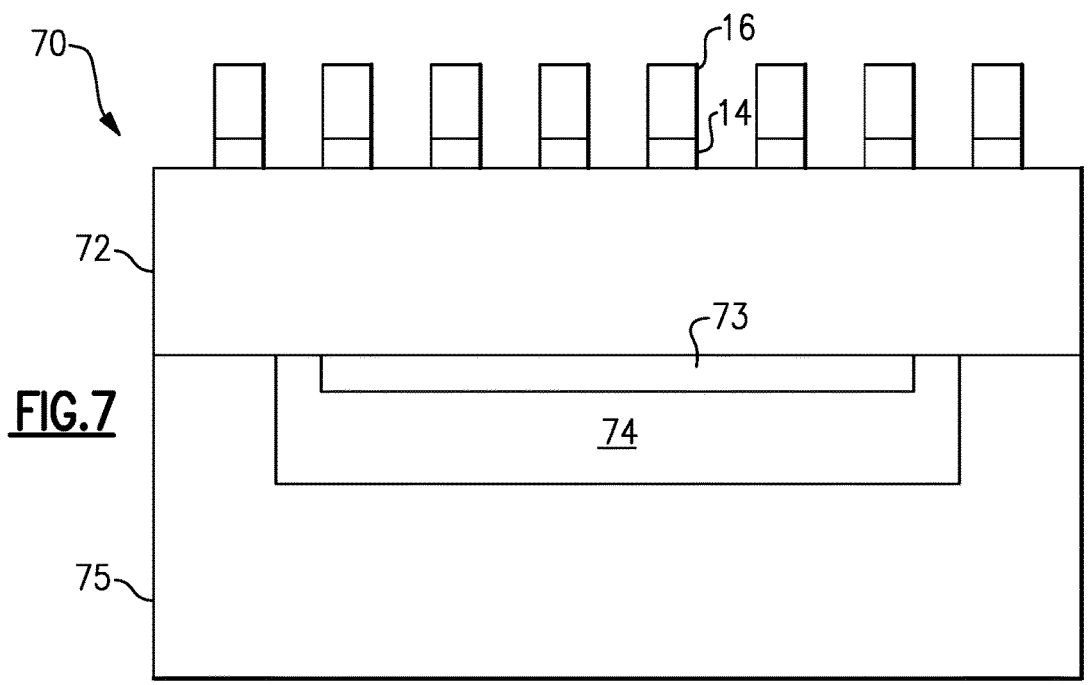
FIG. 7 is a cross sectional view of a Lamb wave resonator according to an embodiment.

FIG. 7 is a cross sectional view of a Lamb wave resonator 70 according to an embodiment. As illustrated in FIG. 7, a multi-layer IDT electrode can be implemented in a free-standing Lamb wave resonator. The Lamb wave resonator 70 includes a multi-layer IDT electrode, a piezoelectric layer 72, a lower electrode 73, an air gap 74, and a substrate 75. The multi-layer IDT electrode includes a first IDT electrode layer 14 and a second IDT electrode layer 16. These IDT electrode layers of the Lamb wave resonator 70 can be implemented in accordance with any suitable principles and advantages disclosed herein. The piezoelectric layer 72 can be any suitable piezoelectric layer, such as an aluminum nitride layer. The substrate 75 can be a semiconductor substrate, such as a silicon substrate. The air gap 74 can be an air cavity. The air gap 74 can be etched into the substrate 75 as illustrated. Alternatively, the air gap 74 can be implemented over the substrate 75.

Figure 8:
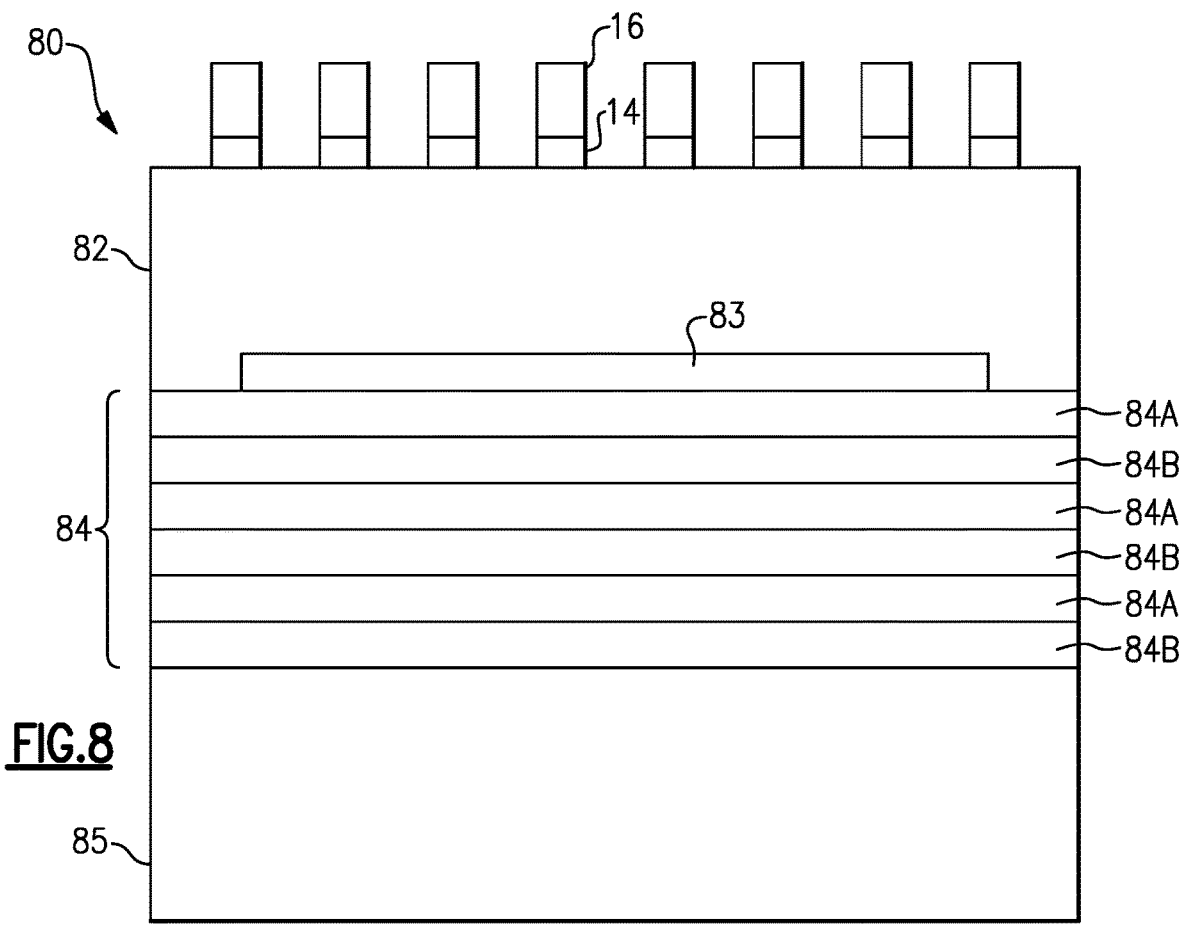
FIG. 8 is a cross sectional view of a Lamb wave resonator according to another embodiment.

FIG. 8 is a cross sectional view of a Lamb wave resonator 80 according to an embodiment. As illustrated in FIG. 8, a multi-layer IDT electrode can be implemented in a solidly mounted Lamb wave resonator. The Lamb wave resonator 80 includes a multi-layer IDT electrode, a piezoelectric layer 82, a lower electrode 83, an acoustic mirror 84, and a substrate 85. The multi-layer IDT electrode includes a first IDT electrode layer 14 and a second IDT electrode layer 16. These IDT electrode layers of the Lamb wave resonator 80 can be implemented in accordance with any suitable principles and advantages disclosed herein. The piezoelectric layer 82 can be any suitable piezoelectric layer, such as an aluminum nitride layer. The acoustic Bragg reflector 84 can include alternating low impedance layers 84A and high impedance layers 84B. For instance, the acoustic Bragg reflector 84 can include alternating layers of silicon dioxide as low impedance layers 84A and tungsten as high impedance layers 84B. The substrate 85 can be a semiconductor substrate, such as a silicon substrate.

According to some other embodiments (not illustrated), a multi-layer IDT electrode in accordance with any suitable principles and advantages disclosed herein can be implemented in a boundary wave resonator. Any of the principles and advantages disclosed herein can be implemented in any suitable acoustic wave resonator that includes an IDT electrode.

The acoustic wave devices disclosed herein can be implemented in a variety of packaged modules. An example packaged module will now be described in which any suitable principles and advantages of the acoustic wave resonators disclosed herein can be implemented. A packaged module can include one or more features of the packaged module of FIG. 9 and/or the packaged module of FIG. 10.

Figure 9:
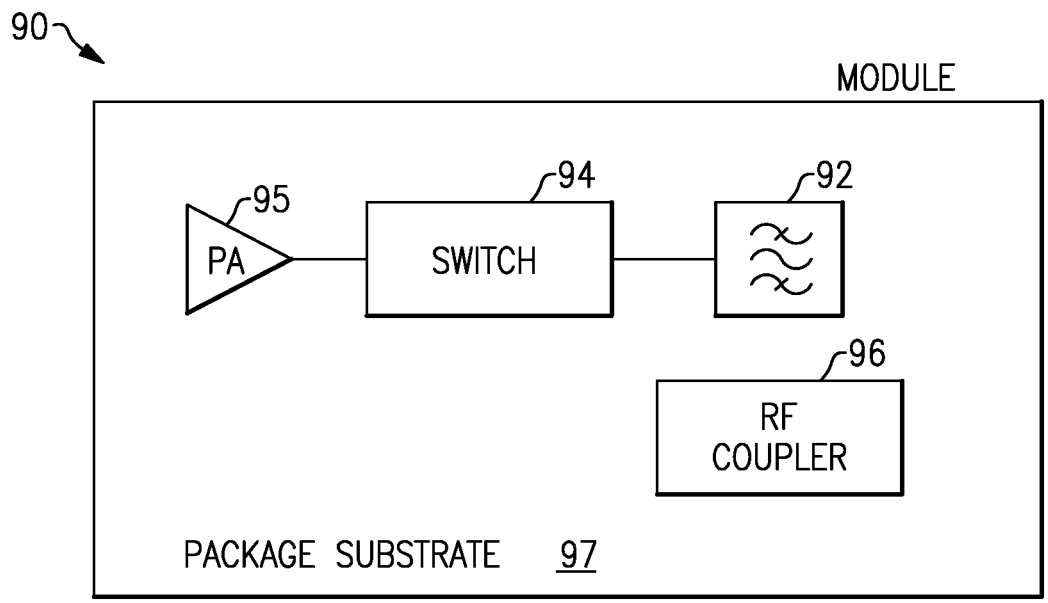
FIG. 9 is a schematic block diagram of a packaged module that includes a filter with an acoustic wave device according to an embodiment.

FIG. 9 is a schematic block diagram of a module 90 that includes a filter 92 with an acoustic wave device in accordance with any suitable principles and advantage disclosed herein. The module 90 includes the filter 92 that includes an acoustic wave device, a switch 94, a power amplifier 95, and a radio frequency (RF) coupler 96. The power amplifier 95 can amplify a radio frequency signal. The switch 94 can selectively electrically couple an output of the power amplifier 95 to the filter 92. The filter 92 can be a band pass filter. The filter 92 can be included in a duplexer or other multiplexer. The RF coupler 96 can be a directional coupler or any other suitable RF coupler. The RF coupler 96 can sample a portion of RF power in a transmit signal path and provide an indication of the RF power. The RF coupler 96 can be coupled to the transmit signal path in any suitable point, such as between an output of the power amplifier 95 and an input to the switch 94. The module 90 can include a package that encloses the illustrated elements. The filter 92 with the acoustic wave resonator can be disposed on a common packaging substrate 97 with the other illustrated elements of the module 90. The packaging substrate 97 can be a laminate substrate, for example.

Figure 10:
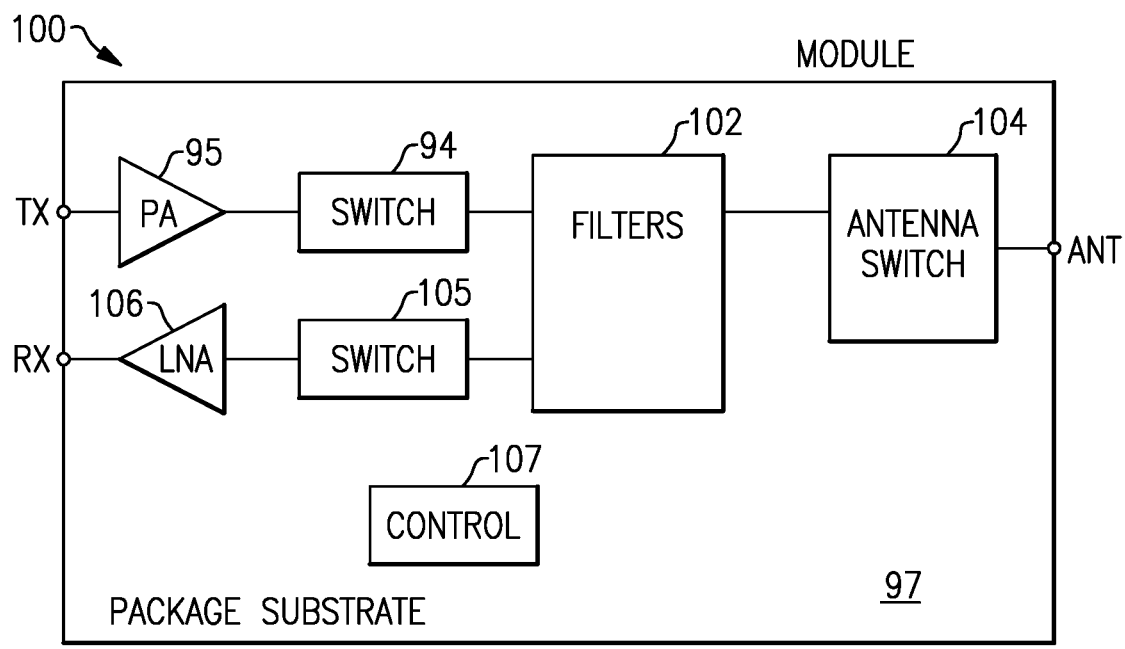
FIG. 10 is a schematic block diagram of a packaged module that includes a filter with an acoustic wave device according to another embodiment.

FIG. 10 is a schematic block diagram of a module 100 that includes filters 102 that include one or more acoustic wave devices in accordance with any suitable principles and advantage disclosed herein. As illustrated, the module 100 includes a power amplifier 95, a switch 94, filters 102, an antenna switch 104, a switch 105, a low noise amplifier 106, and a control circuit 107.

The power amplifier 95 can receive a radio frequency signal from a transmit port TX. In some instances, a switch can electrically connect a selected one of a plurality of transmit ports to an input of the power amplifier 95. The power amplifier 95 can operate in an envelope tracking mode and/or an average power tracking mode. The switch 94 can be a multi-throw radio frequency switch configured to electrically connect an output of the power amplifier 95 to one or more selected transmit filters of the filters 102. The switch 94 can be a band select switch arranged to electrically connect the output of the power amplifier 95 to a transmit filter for a particular frequency band.

The filters 102 can be acoustic wave filters. One or more resonators in any of the filters 102 can include a multi-layer IDT electrode in accordance with any suitable principles and advantages disclosed herein. In certain applications, all acoustic resonators of one or more filters of the filters 102 include a multi-layer IDT electrode in accordance with any suitable principles and advantages disclosed herein. The filters 102 can include a plurality of duplexers and/or other multiplexers. Alternatively or additionally, the filters 102 can include one or more standalone transmit filters and/or one or more standalone receive filters. The filters 102 can include at least four duplexers in some applications. According to some other applications, the filters 102 can include at least eight duplexers.

As illustrated, the filters 102 are electrically connected to the antenna switch 104. The antenna switch 104 can be a multi-throw radio frequency switch arranged to electrically connect one or more filters of the filters 102 to an antenna port ANT of the module 100. The antenna switch 104 can include at least eight throws in some applications. In certain applications, the antenna switch 104 can include at least ten throws.

A switch 105 can electrically connect a selected receive filter of the filters to a low noise amplifier 106. The low noise amplifier 106 is arranged to amplify the received radio frequency signal and provide an output to a receive port RX. In some instances, another switch can be electrically coupled between the low noise amplifier 106 and the receive port RX.

The illustrated module 100 also includes a control circuit 107. The control circuit 107 can perform any suitable control functions for the module 100.

Figure 11A:
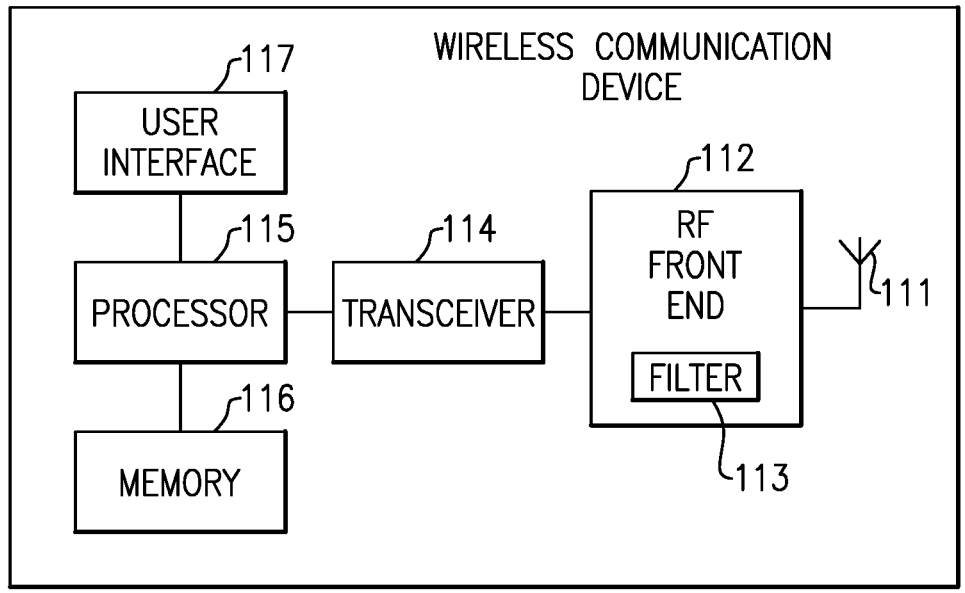
FIG. 11A is a schematic block diagram of a wireless communication device that includes a filter with an acoustic wave device according to an embodiment.

FIG. 11A is a schematic block diagram of a wireless communication device 110 that includes a filter 113 with an acoustic wave device in accordance with one or more embodiments. The wireless communication device 110 can be any suitable wireless communication device. For instance, a wireless communication device 110 can be a mobile phone, such as a smart phone. As illustrated, the wireless communication device 110 includes an antenna 111, an RF front end 112, an RF transceiver 114, a processor 115, a memory 116, and a user interface 117. The antenna 111 can transmit RF signals provided by the RF front end 112. The antenna 111 can provide received RF signals to the RF front end 112 for processing.

The RF front end 112 can include one or more power amplifiers, one or more low noise amplifiers, one or more RF switches, one or more receive filters, one or more transmit filters, one or more duplex filters, one or more filters of a multiplexer, one or more filters of a diplexer or other frequency multiplexing circuit, or any suitable combination thereof. The RF front end 112 can transmit and receive RF signals associated with any suitable communication standard. Any of the acoustic resonators disclosed herein can be implemented in filter 113 of the RF front end 112.

The RF transceiver 114 can provide RF signals to the RF front end 112 for amplification and/or other processing. The RF transceiver 114 can also process an RF signal provided by a low noise amplifier of the RF front end 112. The RF transceiver 114 is in communication with the processor 115. The processor 115 can be a baseband processor. The processor 115 can provide any suitable base band processing functions for the wireless communication device 110. The memory 116 can be accessed by the processor 115. The memory 116 can store any suitable data for the wireless communication device 110. The processor 115 is also in communication with the user interface 117. The user interface 117 can be any suitable user interface, such as a display.

Figure 11B:
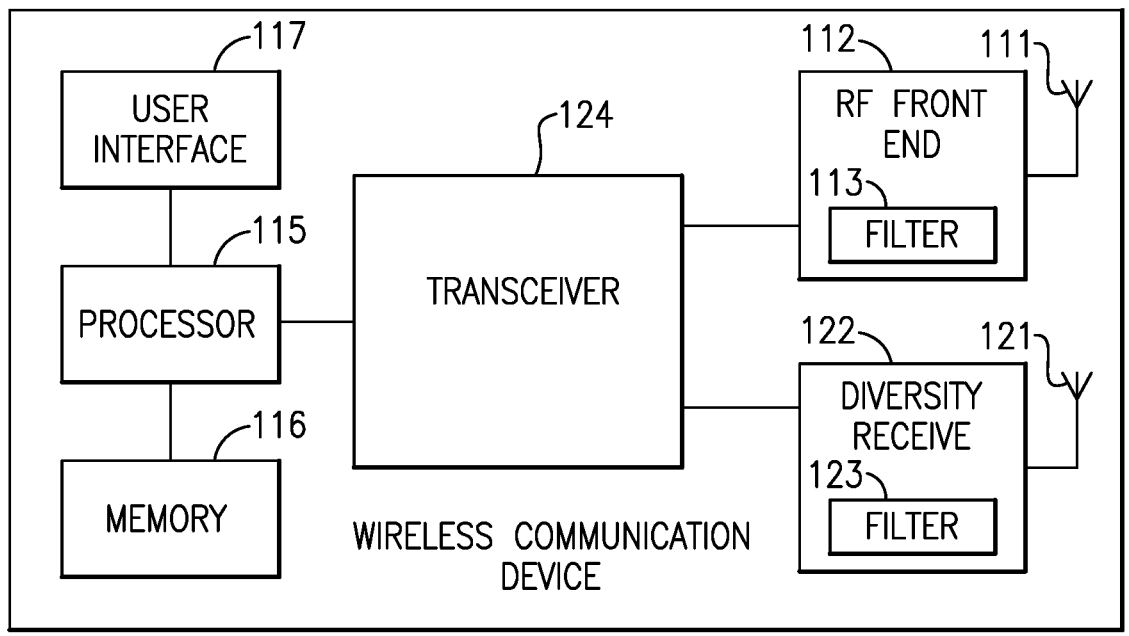
FIG. 11B is a schematic block diagram of a wireless communication device that includes a filter with an acoustic wave device according to another embodiment.

FIG. 11B is a schematic block diagram of a wireless communication device 120 that includes a radio frequency front end 112 with a filter 113 and a diversity receive module 122 with a filter 123 according to an embodiment. The wireless communication device 120 is like the wireless communication device 100 of FIG. 11A, except that the wireless communication device 120 also includes diversity receive features. As illustrated in FIG. 11B, the wireless communication device 120 includes a diversity antenna 121, a diversity module 122 configured to process signals received by the diversity antenna 121 and including filters 123, and a transceiver 124 in communication with both the radio frequency front end 122 and the diversity receive module 122. The filter 103 can include one or more acoustic wave resonators having any suitable IDT electrode disclosed herein. The filter 123 can include any can include one or more acoustic wave resonators having any suitable IDT electrode disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kilohertz (kHz) to 300 gigahertz (GHz), such as in a frequency range from about 450 MHz to 8.5 GHz. An acoustic wave resonator including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a piezoelectric layer;
an interdigital transducer electrode on the piezoelectric layer, the interdigital transducer electrode including a first interdigital transducer electrode layer and a second interdigital transducer electrode layer, the first interdigital transducer electrode layer being positioned between the second interdigital transducer electrode layer and the piezoelectric layer, the second interdigital transducer electrode layer including aluminum and having a thickness of at least 200 nanometers, the second interdigital transducer electrode layer being sufficiently thick to saturate insertion loss improvement associated with the thickness of the second interdigital transducer electrode layer; and
a temperature compensation layer, the interdigital transducer electrode being positioned between the piezoelectric layer and at least a portion of the temperature compensation layer.

2. The acoustic wave device of claim 1 wherein the acoustic wave device is a surface acoustic wave device configured to generate a surface acoustic wave.

3. The acoustic wave device of claim 1 wherein the thickness of the second interdigital transducer electrode layer is at least 250 nanometers.

4. The acoustic wave device of claim 1 wherein the thickness of the second interdigital transducer electrode layer is less than 500 nanometers.

5. The acoustic wave device of claim 1 wherein the temperature compensation layer is a silicon dioxide layer.

6. The acoustic wave device of claim 1 wherein the temperature compensation layer has a thickness in a range from 300 nanometers to 2.1 micrometers.

7. The acoustic wave device of claim 1 wherein the first interdigital transducer electrode layer is thinner than the second interdigital transducer electrode layer.

8. The acoustic wave device of claim 1 wherein the first interdigital transducer electrode layer has a first side and a second side opposite the first side, the first side being in physical contact with the piezoelectric layer, and the second side being in physical contact with the second interdigital transducer electrode layer.

9. The acoustic wave device of claim 8 wherein the second interdigital transducer electrode layer is in physical contact with the temperature compensation layer on a side opposite to the first interdigital transducer electrode.

10. The acoustic wave device of claim 1 further comprising a support substrate, the piezoelectric layer being positioned over the support substrate.

11. An acoustic wave device comprising:
a piezoelectric layer;
an interdigital transducer electrode on the piezoelectric layer, the interdigital transducer electrode including a first interdigital transducer electrode layer and a second interdigital transducer electrode layer, the first interdigital transducer electrode layer being positioned between the second interdigital transducer electrode layer and the piezoelectric layer, the first interdigital transducer electrode layer including molybdenum, the second interdigital transducer electrode layer including aluminum and having a thickness of at least 200 nanometers; and
a temperature compensation layer, the interdigital transducer electrode being positioned between the piezoelectric layer and at least a portion of the temperature compensation layer.

12. The acoustic wave device of claim 1 wherein the piezoelectric layer includes a lithium niobate layer.

13. The acoustic wave device of claim 11 wherein the thickness of the second interdigital transducer electrode layer is sufficiently thick to saturate insertion loss improvement associated with the thickness of the second interdigital transducer electrode layer.

14. An acoustic wave filter with reduced insertion loss, the acoustic wave filter comprising:
an acoustic wave resonator that includes a piezoelectric layer, a temperature compensation layer, and an interdigital transducer electrode positioned between the piezoelectric layer and at least a portion of the temperature compensation layer, the interdigital transducer electrode including a first interdigital transducer electrode layer and a second interdigital transducer electrode layer, the first interdigital transducer electrode layer being positioned between the second interdigital transducer electrode layer and the piezoelectric layer, the second interdigital transducer electrode layer including aluminum and having a thickness of at least 200 nanometers; and
a plurality of additional acoustic wave resonators, the acoustic wave resonator and the plurality of additional acoustic wave resonators together configured as a band pass filter with a radio frequency pass band, and the thickness of the second interdigital transducer electrode layer causing insertion loss in the radio frequency pass band to be reduced.

15. The acoustic wave filter of claim 14 wherein the thickness of the second interdigital transducer electrode layer is sufficiently thick to saturate insertion loss improvement associated with the thickness of the second interdigital transducer electrode layer.

16. The acoustic wave filter of claim 14 wherein the thickness of the second interdigital transducer electrode layer is less than 500 nanometers.

17. The acoustic wave filter of claim 14 wherein the temperature compensation layer is a silicon dioxide layer.

18. The acoustic wave filter of claim 14 wherein the first interdigital transducer electrode layer includes molybdenum.

19. The acoustic wave filter of claim 14 wherein the band pass filter has a center frequency in a range from 1.5 gigahertz to 2.5 gigahertz.

20. A method of filtering a radio frequency signal with reduced insertion loss, the method comprising:
providing a radio frequency signal to a surface acoustic wave filter, the surface acoustic wave filter including a temperature compensated surface acoustic wave resonator, the temperature compensated surface acoustic wave resonator including an interdigital transducer electrode on a piezoelectric layer and a temperature compensation layer over the interdigital transducer electrode, the interdigital transducer electrode including a first interdigital transducer layer and a second interdigital transducer layer positioned over the first interdigital transducer layer, the second interdigital transducer layer including an aluminum layer having a thickness of at least 200 nanometers, the second interdigital transducer electrode layer being sufficiently thick to saturate insertion loss improvement associated with the thickness of the second interdigital transducer electrode layer; and
filtering the radio frequency signal with the surface acoustic wave filter.

* * * * *